US009666535B2

(12) United States Patent
Song et al.

(10) Patent No.: US 9,666,535 B2
(45) Date of Patent: May 30, 2017

(54) FLEXIBLE DISPLAY PANEL

(71) Applicant: BOE Technology Group Co., Ltd., Beijing (CN)

(72) Inventors: Song Song, Beijing (CN); Nagayama Kazuyoshi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/769,171

(22) PCT Filed: Nov. 21, 2014

(86) PCT No.: PCT/CN2014/091887
§ 371 (c)(1),
(2) Date: Aug. 20, 2015

(87) PCT Pub. No.: WO2016/019653
PCT Pub. Date: Feb. 11, 2016

(65) Prior Publication Data
US 2016/0254286 A1    Sep. 1, 2016

(30) Foreign Application Priority Data

Aug. 6, 2014   (CN) .......................... 2014 1 0383884

(51) Int. Cl.
*H01L 23/538*   (2006.01)
*H01L 23/52*    (2006.01)
(Continued)

(52) U.S. Cl.
CPC ...... *H01L 23/5386* (2013.01); *G02F 1/13452* (2013.01); *H01L 23/48* (2013.01);
(Continued)

(58) Field of Classification Search
CPC ... H01L 27/1244; H01L 23/52; H01L 23/535; H01L 23/538; H01L 23/5386; H01L 23/5387

See application file for complete search history.

(56) References Cited

U.S. PATENT DOCUMENTS 6,104,465 A    8/2000  Na et al.
6,618,111 B1 *  9/2003  Nagata ................ G02F 1/13452
                                                      345/98
(Continued)

FOREIGN PATENT DOCUMENTS

CN         1743927 A      3/2006
CN         1808780 A      7/2006
(Continued)

OTHER PUBLICATIONS

First Office Action, including Search Report, for Chinese Patent Application 201410383884.3, dated Feb. 3, 2016, 10 pages.
(Continued)

*Primary Examiner* — Fei Fei Yeung Lopez
(74) *Attorney, Agent, or Firm* — Westman, Champlin & Koehler, P.A.

(57) ABSTRACT

Embodiments of the present invention disclose a flexible display panel. The flexible display panel at least comprises an display area, a fanout area and a driver circuit area, wherein the fanout area is positioned between the display area and the driver circuit area to connect the display area with the driver circuit area, and the fanout area comprises at least one zig-zag fanout wire, each of which comprises a plurality of fanout wire segments divided by bending points. In the technical solutions of the present invention, by utilizing a zig-zag wiring manner, damage to metal wires when bending is reduced, bending resistance of the fanout
(Continued)

area is improved and damage to the screen when bending the flexible display panel is avoided or reduced.

16 Claims, 3 Drawing Sheets

(51) Int. Cl.
*H01L 23/48* (2006.01)
*H01L 27/12* (2006.01)
*G02F 1/1345* (2006.01)
*H01L 51/00* (2006.01)
*H01L 27/32* (2006.01)
*G02F 1/1333* (2006.01)

(52) U.S. Cl.
CPC ............ *H01L 23/52* (2013.01); *H01L 23/538* (2013.01); *H01L 23/5387* (2013.01); *H01L 27/1218* (2013.01); *H01L 27/1244* (2013.01); *G02F 1/133305* (2013.01); *G09G 2380/02* (2013.01); *H01L 27/3297* (2013.01); *H01L 51/0097* (2013.01); *H01L 2924/0002* (2013.01)

(56) References Cited

U.S. PATENT DOCUMENTS

| | | | |
|---|---|---|---|
| 7,113,246 B2 | 9/2006 | Yamaguchi et al. | |
| 7,374,435 B2 | 5/2008 | Idenishi | |
| 7,821,588 B2 | 10/2010 | Chang et al. | |
| 8,008,665 B2 | 8/2011 | Yang et al. | |
| 2003/0099097 A1* | 5/2003 | Mok | G01R 1/06716 361/767 |
| 2003/0174072 A1* | 9/2003 | Salomon | G06F 3/0238 341/22 |
| 2008/0157364 A1* | 7/2008 | Yang | G02F 1/1345 257/741 |
| 2011/0075089 A1* | 3/2011 | Jheng | G02F 1/1345 349/152 |

FOREIGN PATENT DOCUMENTS

| | | |
|---|---|---|
| CN | 101118732 A | 2/2008 |
| CN | 101202289 A | 6/2008 |
| CN | 102253507 A | 11/2011 |
| CN | 104157233 A | 11/2014 |
| TW | I300496 B | 9/2008 |
| TW | 201100905 A1 | 1/2011 |
| TW | 201211959 A1 | 3/2012 |

OTHER PUBLICATIONS

International Search Report and Written Opinion for PCT Application No. PCT/CN2014/091887, dated May 12, 2015, 10 pages.
English translation of Box No. V from the Written Opinion of the International Searching Authority for PCT Application No. PCT/CN2014/091887, 3 pages.
Third Office Action, including Search Report, for Chinese Patent Application No. 201410383884.3, dated Oct. 21, 2016, 9 pages.

\* cited by examiner

FLEXIBLE DISPLAY PANEL

CROSS-REFERENCE TO RELATED APPLICATION

This application is a Section 371 National Stage Application of International Application No. PCT/CN2014/091887, filed 21 Nov. 2014, which claims the benefit of Chinese Patent Application No. 201410383884.3 filed on Aug. 6, 2014 in the State Intellectual Property Office of China, the whole disclosure of which is incorporated herein by reference.

BACKGROUND OF THE INVENTION

Field of the Invention

Embodiments of the present invention relate to a technical field of display panel, in particular, to a flexible display panel and a display apparatus comprising the display panel.

Description of the Related Art

The flexible display panel is a bendable and deformable display panel or display screen made of flexible material, and it has many advantages such as low power consumption, small size, lightweight, easy to install, convenient for transportation, diverse display manners, excellent display quality and so on. The flexible display panel is mainly used in portable electronic devices and touch input device, etc., and it has a broad developing prospect.

The screen is easy to be damaged when the flexible display panel is bent. The damage is not only present in a display area (active area) of the flexible display panel, but also present in a fanout area between the display area and a driver circuit area.

FIG. 1 is a schematic view showing the positional relationship among a driver circuit area 1, a fanout area 2 and a display area 3 in the existing flexible display panel. As shown in FIG. 1, the driver circuit area 1 may comprise a driver IC and/or a gate driver on array circuit (gate driver on array (GOA)). The driver IC comprises a gate IC in the row direction and a source IC in the column direction; the gate driver on array circuit is a circuit in which the gate driver circuit is directly foamed on a substrate to replace the driver chip formed from an external silicon chip. As shown in FIG. 1, the fanout area 2 utilizes a linear wiring manner, in which pins of the driver circuit area 1 are connected with the display area 3 through linear wires. With this wiring manner, the bending force generated when bending the flexible display panel totally acts on the linear wires of the fanout area 2, as a result, the fanout area 2 is easy to be broken and damaged when bending.

Further, the existing driver IC is generally disposed in the middle portion above the fanout area, as shown in FIG. 1. This arrangement facilitates wiring, but causes that the entire flexible display panel is not bendable along the dotted line a in FIG. 1. Also, in the prior art, the gate driver on array circuit is generally disposed along the frame of the display area 3 (not shown in FIG. 1). Though the gate driver on array circuit is bendable in this case, it is easy to be damaged and the characteristics thereof may change during the bending.

SUMMARY OF THE INVENTION

In view of the above, the main object of the present invention is to provide a flexible display panel, so as to avoid or reduce the damage to the screen when the flexible display panel is bent and to realize an undamaged bending of the flexible display panel in all directions.

In order to achieve the above object, an aspect of the present invention provides a flexible display panel. The flexible display panel comprises at least an display area, a fanout area and a driver circuit area. The fanout area is positioned between the display area and the driver circuit area to connect the display area and the driver circuit area, wherein the fanout area comprises at least one zig-zag fanout wire, each of which comprises a plurality of fanout wire segments divided by bending points.

According to an embodiment of the present invention, the driver circuit area is disposed at at least one corner of four corners of the display area.

According to an embodiment of the present invention, the driver circuit area comprises a driver IC and/or a gate driver on array circuit.

According to an embodiment of the present invention, one zig-zag fanout wire of the fanout area is used to connect one pin of the driver IC with the display area, or one zig-zag fanout wire of the fanout area is used to connect one pin of the gate driver on array circuit with the display area.

According to an embodiment of the present invention, the fanout wire segments positioned on opposite sides of the bending point are made of one kind of metal material or two kinds of metal material.

According to an embodiment of the present invention, the fanout wire segments positioned on opposite sides of the bending point are positioned in the same layer or in different layers.

According to an embodiment of the present invention, if the fanout wire segments positioned on opposite sides of each bending point of one zig-zag fanout wire are positioned in different layers, the fanout wire segments positioned on opposite sides of each bending point are electrically connected through a via hole at the bending point so that the whole zig-zag fanout wire are electrically conductive.

According to an embodiment of the present invention, the fanout wire segments of one zig-zag fanout wire are located alternately in two layers.

According to an embodiment of the present invention, the fanout wire segments of different zig-zag fanout wires are capable of being located in the same layer.

According to an embodiment of the present invention, the driver IC or the gate driver on array circuit at any position outside and near to each of the four corners of the display area.

According to an embodiment of the present invention, in the fanout area, the fanout wire segments in different layers intersect with each other respectively and the fanout wire segments in the same layer are parallel with each other respectively.

Another aspect of the present invention provides a display apparatus comprising any one of the above display panels.

Embodiments of the present invention have the following beneficial effects:

(1) by utilizing a zig-zag wiring manner in the fanout area between the driver IC and the display area, or between the gate driver on array circuit and the display area, damage to the fanout wires such as metal wires upon bending is reduced, bending resistance of the fanout area is improved and damage to the screen upon bending the flexible display panel is avoided or reduced.

(2) by utilizing a zig-zag wiring manner in the fanout area between the driver IC and the display area, or between the gate driver on array circuit and the display area, the length and the width of the fanout area are efficiently reduced and thus it is advantageous for the flexible display panel to achieve a multi-directional bending.

(3) by disposing the driver IC or the gate driver on array circuit at four corners of the display area, the driver IC or the gate driver on array circuit will not be damaged when the flexible display panel is bent and an all-direction undamaged bending of the flexible display panel is realized.

DETAILED DESCRIPTION OF PREFERRED EMBODIMENTS OF THE INVENTION

Figure 1:
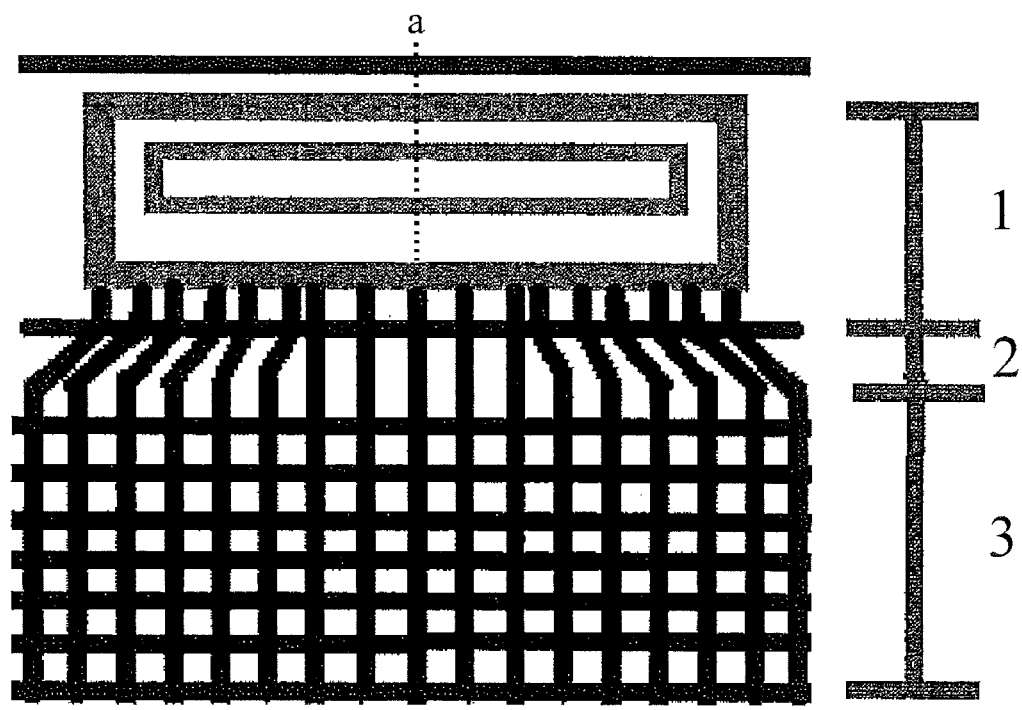
FIG. 1 is a schematic view showing the positional relationship among the driver circuit area, the fanout area and the display area in the existing flexible display panel.

In order to make objects, technical solutions and advantages of the invention more clear and apparent, hereinafter, the technical solutions of the invention will be described in detail in connection with the specific embodiments and referring to the accompanying drawings.

The essential concept of the flexible display panel according to the embodiments of the present invention is: by utilizing a zig-zag wiring manner in the fanout area between the display area (AA) and the driver circuit area, damage to metal wires upon bending is reduced, bending resistance of the fanout area is improved and damage to the screen when bending the flexible display panel is avoided or reduced, thereby realizing an undamaged bending of the flexible display panel.

According to an embodiment of the present invention, the flexible display panel comprises at least an display area, a fanout area and a driver circuit area. The fanout area is positioned between the display area and the driver circuit area to connect the display area and the driver circuit area, wherein the fanout area comprises at least one zig-zag fanout wire, each of which comprises a plurality of fanout wire segments divided by bending points.

In the embodiment, a zig-zag wiring manner is used in the fanout area between the display area and the driver circuit area, so that damage to the fanout wires when bending may be reduced. For example, the fanout wires are made of metal wires.

Specifically, the driver circuit area may comprise a driver IC and/or a gate driver on array circuit (gate driver on array). In that case, the zig-zag wiring manner used in the fanout area refers to that the fanout area uses a zig-zag fanout wire to connect a pin of the driver IC with the display area, or the fanout area uses a zig-zag fanout wire to connect a pin of the gate driver on array circuit with the display area. By utilizing a zig-zag wiring manner in the fanout area between the display area and the driver circuit area, bending resistance of the fanout area is improved and damage to the screen when bending the flexible display panel is avoided or reduced. Further, By utilizing a zig-zag wiring manner in the fanout area between the display area and the driver circuit area, the length and the width of the fanout area are efficiently reduced, which is advantageous to achieve a multi-directional bending of the flexible display panel.

A plurality of fanout wire segments divided by the bending points of the zig-zag fanout wire may be disposed in the same layer or in different layers. The two fanout segments positioned in different layers and divided by one bending point may be connected through a via hole at the bending point. The fanout segments of the same one zig-zag fanout wire positioned in different layers may be connected through via holes at each bending point, so that the entire zig-zag fanout wire is electrically conductive. The two fanout wire segments connected by the via hole may be made of one kind of metal material or two kinds of metal material.

According to an embodiment of the present invention, the driver circuit area is disposed at one of four corners of the display area. Specifically, it refers to that the driver IC or the gate driver on array circuit is disposed in any position outside the display area and near the four corners of the display area. By disposing the driver IC or the gate driver on array circuit in any position outside the display area and near the four corners of the display area, the driver IC or the gate driver on array circuit will not be damaged when bending the flexible display panel, thereby realizing an omnidirectionally undamaged bending of the flexible display panel.

Figure 2:
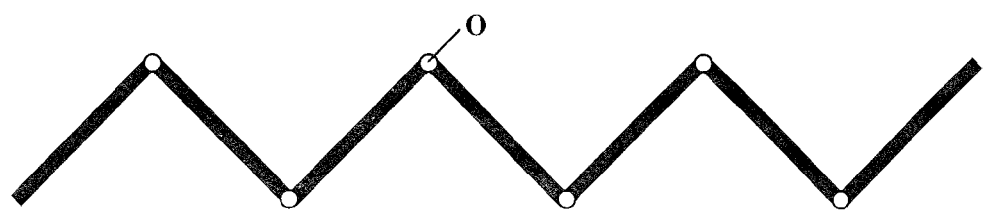
FIG. 2 is a schematic view of a zig-zag fanout wire when a zig-zag wiring manner is used in the fanout area according to an embodiment of the present invention.
Figure 3:
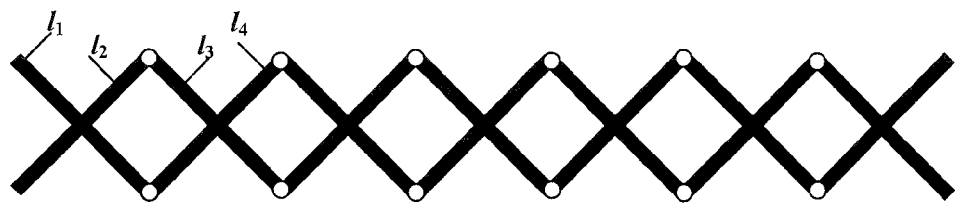
FIG. 3 is a schematic view of two zig-zag fanout wires when a zig-zag wiring manner is used in the fanout area according to an embodiment of the present invention.
Figure 4:
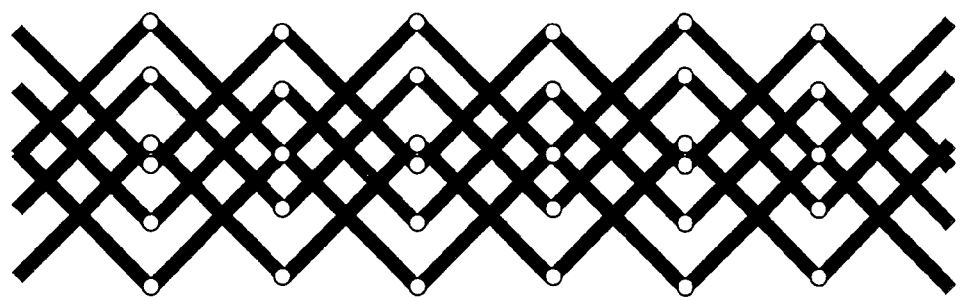
FIG. 4 is a schematic view of six zig-zag fanout wires when a zig-zag wiring manner is used in the fanout area according to an embodiment of the present invention.

FIGS. 2-4 show schematic views of one, two and six zig-zag fanout wires when a zig-zag wiring manner is used in the fanout area according to an embodiment of the present invention, respectively.

FIG. 2 shows one zig-zag fanout wire. The segments of the zig-zag fanout wire are connected through via holes O at the bending point so that the entire zig-zag fanout wire is conductive.

FIG. 3 shows two zig-zag fanout wires. As shown in FIG. 3, a metal wire segment $l_2$ and a metal wire segment $l_3$ belong to the same one zig-zag fanout wire, but are positioned in different layers and are connected through a via hole. Similarly, a metal wire segment $l_1$ and a metal wire segment $l_4$ belong to the same one zig-zag fanout wire, but are positioned in different layers and are connected through a via hole. The metal wire segment $l_2$ and a metal wire segment $l_4$ may be positioned in the same layer and the metal wire segment $l_1$ and the metal wire segment $l_3$ may be positioned in the same layer, or the four metal wire segments may be positioned in different layers. The metal wire segments $l_1$, $l_2$, $l_3$ and $l_4$ are examples of fanout wire segments.

The fanout wire segments of the same zig-zag fanout wire as shown in FIG. 3 may be positioned in two layers alternately. Also, The fanout wire segments of the different zig-zag fanout wires may be positioned in the same layer. Thereby, two zig-zag fanout wires can share two layers, so that the wiring layers of the fanout area are reduced.

In addition, as shown in FIG. 3, the two zig-zag fanout wires in the fanout area intersect with each other so as to save the space of the fanout area. Specifically, the metal wire segment $l_1$ of one zig-zag fanout wire and the metal wire segment $l_2$ of another zig-zag fanout wire may intersect with each other in different layers of the fanout area. Similarly, the metal wire segment $l_4$ of one zig-zag fanout wire and the metal wire segment $l_3$ of another zig-zag fanout wire may intersect with each other in different layers of the fanout area.

Further, as shown in FIG. 3, in the fanout area, the metal wire segments positioned in the same layer may be parallel with each other no matter whether they belong to the same zig-zag fanout wire or not. For example, the metal wire segment $l_1$ and the metal wire segment $l_3$ are positioned in the same layer and parallel with each other, the metal wire segment $l_2$ and the metal wire segment $l_4$ are positioned in the same layer and parallel with each other. Also, as shown in FIG. 3, in the fanout area, the metal wire segments positioned in different layers intersect with each other respectively. For example, the metal wire segment $l_1$ and the metal wire segment $l_2$ are positioned in different layers and intersect with each other, the metal wire segment $l_3$ and the metal wire segment $l_4$ are positioned in different layers and intersect with each other, and so on. This arrangement facilitates saving space and avoiding mutual interference between the metal wire segments in the same layer.

FIG. 4 shows six zig-zag fanout wires. The connection between the metal wire segments forming each zig-zag fanout wire is the same as the examples as shown in FIG. 2 and FIG. 3, and it will be omitted here. In addition, as shown in FIG. 4, the six fanout wires are divided into two groups, in which the three fanout wires are in a parallel arrangement and the other three fanout wires are in a parallel arrangement. Further, the three fanout wires intersect with the other three fanout wires. Similarly, the metal wire segments positioned in different layers intersect with each other and the metal wire segments positioned in the same layer are parallel with each other.

Figure 5:
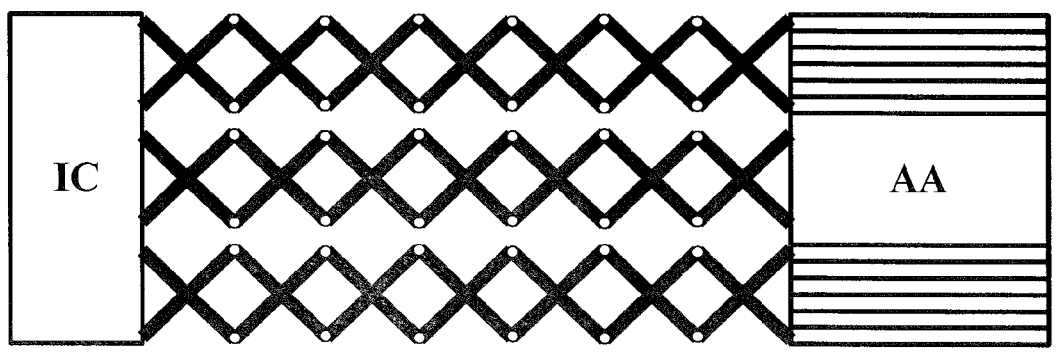
FIG. 5 is a schematic view showing the zig-zag wiring used in the fanout area between the driver IC and the display area according to an embodiment of the present invention.

FIG. 5 is a schematic view showing the zig-zag wiring used in the fanout area between the driver IC and the display area according to an embodiment of the present invention. As shown in FIG. 5, a plurality of zig-zag fanout wires are used in the fanout area between the driver IC and the display area.

In the embodiment of the present invention, the zig-zag wiring manner is used in the fanout area between the display area and the driver circuit area, so that the damage to the metal wires when bending is reduced. Further, besides protecting the metal wires from damage by bending, the zig-zag wiring manner also saves space and reduces the length and the width of the fanout area, thereby the requirements of various possible wiring may be met.

Figure 6:
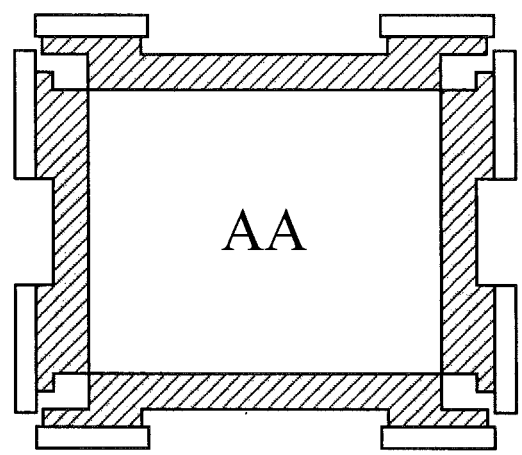
FIG. 6 is a schematic view in which driver ICs are disposed at four corners of the display area according to an embodiment of the present invention.
Figure 7:
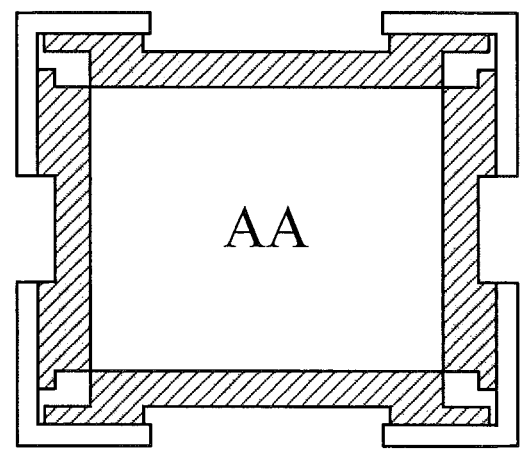
FIG. 7 is a schematic view in which gate driver on array circuits are disposed at four corners of the display area according to an embodiment of the present invention.

FIG. 6 is a schematic view in which the driver ICs are disposed at four corners of the display area according to an embodiment of the present invention. FIG. 7 is a schematic view in which the gate driver on array circuit are disposed at four corners of the display area according to an embodiment of the present invention.

As shown in FIG. 6, an display area (AA) is positioned the central portion, and portions filled with the diagonals in the periphery of the display area (AA) are fanout areas. Each of the fanout area uses the zig-zag wiring as shown in FIGS. 2-5, for example. Rectangle blocks outside the fanout areas filled with the diagonals are areas for disposing driver ICs. The driver IC may be disposed in any one of the rectangle blocks, so that the arrangement in which the driver IC is disposed in the middle portion of an edge of the flexible display panel is avoided, thereby the flexible display panel can be bended freely. If the driver IC is disposed in the middle portion of an edge of the flexible display panel, the flexible display panel will not be bended freely in that edge.

As shown in FIG. 7, an display area (AA) is positioned the central portion, and portions filled with the diagonals in the periphery of the display area are fanout areas. The fanout area uses the zig-zag wiring. The right-angle blocks outside the fanout areas filled with the diagonals are areas for disposing gate driver on array circuit. The gate driver on array circuit may be disposed in any one of the right-angle blocks, so that the arrangement in which the gate driver on array circuit is disposed in the entire edge of the flexible display panel is avoided, thereby the flexible display panel can be bended freely. If the gate driver on array circuit is disposed in the entire edge of the flexible display panel, the edge of the flexible display panel at which the gate driver on array circuit is disposed may be bended freely, but the gate driver on array circuit will be damaged seriously.

In the embodiments as shown in FIGS. 6 and 7, the driver IC is disposed in one of the rectangle blocks at four corners of the display area and the gate driver on array circuit is disposed in one of the right-angle blocks at four corners of the display area. Alternatively, the driver IC may be disposed in one of the right-angle blocks at four corners of the display area and the gate driver on array circuit may be disposed in one of the rectangle blocks at four corners of the display area, embodiments will also achieve the effects of avoiding or reducing damage to the screen when bending the flexible display panel and realizing an omnidirectionally undamaged bending of the flexible display panel.

The flexible display panel according to the embodiments of the present invention can realize an omnidirectionally undamaged bendable flexible display panel. The flexible display panel can be applied in various display apparatus, for example, the portable electronic device and the touch input device such as mobile phone, PDA, notebook computer, navigator, etc.

Specific embodiments described above have explained objects, technical solutions and advantages of the present invention in detail. It should be understood that the above description is only the specific embodiment of the present invention, but is not intended to limit the present invention. Any modifications, equivalents, improvements made within the spirit and principle of the present invention should be included within the scope of the present invention.

What is claimed is:

1. A flexible display panel comprising at least a display area, a fanout area and a driver circuit area, the fanout area being positioned between the display area and the driver circuit area to connect the display area with the driver circuit area, wherein the fanout area comprises at least one zig-zag fanout wire, each of which comprises a plurality of fanout wire segments divided by bending points;

wherein the driver circuit area is disposed at at least one of four corners of the display area; and wherein the driver circuit area comprises a driver IC and/or a gate driver on array circuit.

2. The flexible display panel of claim 1, wherein one zig-zag fanout wire of the fanout area is used to connect one pin of the driver IC with the display area, or one zig-zag fanout wire of the fanout area is used to connect one pin of the gate driver on array circuit with the display area.

3. The flexible display panel of claim 1, wherein the fanout wire segments positioned on opposite sides of the bending point are made of one kind of metal material or two kinds of metal material.

4. The flexible display panel of claim 1, wherein the fanout wire segments positioned on opposite sides of the bending point are positioned in different layers.

5. The flexible display panel of claim 4, wherein the fanout wire segments positioned on opposite sides of each bending point of one zig-zag fanout wire are electrically connected through a via hole at the bending point so that the whole zig-zag fanout wire are electrically conductive.

6. The flexible display panel of claim 4, wherein the fanout wire segments of one zig-zag fanout wire are located alternately in two layers.

7. The flexible display panel of claim 4, wherein the fanout wire segments of different zig-zag fanout wires are capable of being located in the same layer.

8. The flexible display panel of claim 1, wherein the driver IC or the gate driver on array circuit is disposed at any position outside and near to each of the four corners of the display area.

9. The flexible display panel of claim 1, wherein in the fanout area, the fanout wire segments in different layers intersect with each other respectively and the fanout wire segments in the same layer are parallel with each other respectively.

10. A display apparatus comprising the display panel of claim 1.

11. The display apparatus of claim 10, wherein one zig-zag fanout wire of the fanout area is used to connect one pin of the driver IC with the display area, or one zig-zag fanout wire of the fanout area is used to connect one pin of the gate driver on array circuit with the display area.

12. The display apparatus of claim 10, wherein the fanout wire segments positioned on opposite sides of the bending point are made of one kind of metal material or two kinds of metal material.

13. The display apparatus of claim 10, wherein the fanout wire segments positioned on opposite sides of the bending point are positioned in different layers.

14. The display apparatus of claim 13, wherein the fanout wire segments positioned on opposite sides of each bending point of one zig-zag fanout wire are electrically connected through a via hole at the bending point so that the whole zig-zag fanout wire are electrically conductive.

15. The display apparatus of claim 13, wherein the fanout wire segments of one zig-zag fanout wire are located alternately in two layers.

16. The display apparatus of claim 13, wherein the fanout wire segments of different zig-zag fanout wires are capable of being located in the same layer.

* * * * *